US011119160B2

(12) United States Patent
Crescentini et al.

(10) Patent No.: US 11,119,160 B2
(45) Date of Patent: Sep. 14, 2021

(54) HALL SENSOR, CORRESPONDING DEVICES AND METHOD

(71) Applicant: STMicroelectronics S.r.l., Agrate Brianza (IT)

(72) Inventors: Marco Crescentini, Vallefoglia (IT); Michele Biondi, Ravenna (IT); Marco Tartagni, Meldola (IT); Aldo Romani, Rimini (IT); Roberto Canegallo, Rimini (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 16/514,469

(22) Filed: Jul. 17, 2019

(65) Prior Publication Data
US 2020/0025843 A1    Jan. 23, 2020

(30) Foreign Application Priority Data

Jul. 17, 2018    (IT) .................... 102018000007246

(51) Int. Cl.
*G01R 33/06*    (2006.01)
*G01R 33/07*    (2006.01)
(52) U.S. Cl.
CPC ................. *G01R 33/072* (2013.01)
(58) Field of Classification Search
CPC .... G01R 33/07; G01R 33/072; G01R 33/075; G01R 33/0005; G01R 33/0029;
(Continued)

(56) References Cited

U.S. PATENT DOCUMENTS 6,008,643 A    12/1999    Mani et al.
6,433,535 B1    8/2002    Marx et al.
(Continued)

FOREIGN PATENT DOCUMENTS

CH    704 509 A1    8/2012
CN    102636761 A    8/2012
(Continued)

OTHER PUBLICATIONS

Dalessandro et al., "High-Performance Planar Isolated Current Sensor for Power Electronics Applications," *IEEE Transactions on Power Electronics* 22(5):1682-1692, Sep. 2007.
(Continued)

*Primary Examiner* — Thang X Le
(74) *Attorney, Agent, or Firm* — Seed IP Law Group LLP

(57) ABSTRACT

A planar Hall sensing element includes a first pair of sensing electrodes mutually opposed in a first direction across the sensing element and a second pair of sensing electrodes mutually opposed in a second direction across the sensing element, with the second direction orthogonal to the first direction. A first pair of bias electrodes is mutually opposed in a third direction and a second pair mutually opposed in a fourth direction across the sensing element, the fourth direction orthogonal to the third direction. The third and fourth directions are rotated 45° with respect to the first and second directions so each sensing electrode is arranged between a bias electrode of the first pair and second pair. A DC bias current is supplied between the first and second pairs of bias electrodes. First and second Hall voltages are sensed at the first and second pairs of sensing electrodes.

17 Claims, 3 Drawing Sheets

(58) Field of Classification Search
CPC .... G01R 15/20; G01R 15/202; G01R 15/205; G01R 15/183; G01R 15/14; G01D 5/142; G01D 5/145
See application file for complete search history.

(56) References Cited

U.S. PATENT DOCUMENTS

| | | | |
|---|---|---|---|
| 6,480,645 B1* | 11/2002 | Peale | G02B 6/357 359/224.1 |
| 8,810,249 B2* | 8/2014 | Cehelnik | G06F 3/017 324/457 |
| 9,589,767 B2* | 3/2017 | Hoffman | H01J 37/32706 |
| 9,952,291 B2 | 4/2018 | Crescentini et al. | |
| 2007/0090825 A1 | 4/2007 | Shoji | |
| 2008/0238410 A1 | 10/2008 | Charlier et al. | |
| 2009/0121707 A1 | 5/2009 | Schott | |
| 2009/0201017 A1 | 8/2009 | Peev et al. | |
| 2010/0021982 A1 | 1/2010 | Herlitze | |
| 2010/0219821 A1 | 9/2010 | Rocznik et al. | |
| 2012/0001279 A1 | 1/2012 | Hioka et al. | |
| 2012/0133356 A1 | 5/2012 | Charlier et al. | |
| 2012/0210800 A1 | 8/2012 | Huber et al. | |
| 2013/0009659 A1 | 1/2013 | Liu et al. | |
| 2013/0300402 A1 | 11/2013 | Liu et al. | |
| 2014/0070795 A1 | 3/2014 | Kolb et al. | |
| 2014/0070796 A1* | 3/2014 | Reymond | G01D 5/145 324/207.2 |
| 2015/0219689 A1 | 8/2015 | Liu et al. | |
| 2016/0131722 A1 | 5/2016 | Ausserlechner | |
| 2016/0252599 A1 | 9/2016 | Motz et al. | |
| 2017/0030980 A1 | 2/2017 | Kosier et al. | |
| 2017/0030983 A1* | 2/2017 | Crescentini | B64G 1/366 |
| 2017/0248662 A1 | 8/2017 | Santos et al. | |
| 2017/0288131 A1 | 10/2017 | Sun et al. | |
| 2017/0363445 A1 | 12/2017 | Polley et al. | |
| 2017/0363693 A1* | 12/2017 | Polley | G01R 33/0029 |
| 2018/0031644 A1 | 2/2018 | Ausserlechner | |

FOREIGN PATENT DOCUMENTS

| | | |
|---|---|---|
| CN | 104535087 A | 4/2015 |
| CN | 105929343 A | 9/2016 |
| CN | 107076806 A | 8/2017 |
| EP | 2490036 A1 | 8/2012 |
| FR | 2 947 060 A1 | 12/2010 |
| WO | 2005/073744 A1 | 8/2005 |

OTHER PUBLICATIONS

Jiang et al., "Multipath Wide-Bandwidth CMOS Magnetic Sensors," *IEEE Journal of Solid-State Circuits* 52(1):198-209, Jan. 2017.

Ramirez et al., "Octagonal geometry Hall plate designed for the PiezoHall effect measurement," IEEE 28$^{th}$ Symposium on Microelectronics Technology and Devices (SBMICRO 2013), Sep. 2, 2013, 4 pages.

Banjevic et al., "2D CMOS Integrated Magnetometer Based on the Miniaturized Circular Vertical Hall Device," International Solid-State Sensors, Actuators and Microsystems Conference, Denver, Colorado, Jun. 21-25, 2009, pp. 877-880.

Bilotti et al., "Monolithic Magnetic Hall Sensor Using Dynamic Quadrature Offset Cancellation," IEEE Journal of Solid-State Circuits 32(6):829-836, 1997.

Crescentini et al., "A 2 MS/s 10A Hall Current Sensor SoC with Digital Compressive Sensing Encoder in 0.16 μm BCD," ESSCIRC Conference 2016: 42nd European Solid-State Circuits Conference, Lausanne, Switzerland, Sep. 12-15, 2016, pp. 393-396.

Jiang et al., "A Continuous-Time Ripple Reduction Technique for Spinning-Current Hall Sensors," *IEEE Journal of Solid-State Circuits* 49(7):1525-1534, 2014.

* cited by examiner

HALL SENSOR, CORRESPONDING DEVICES AND METHOD

BACKGROUND

Technical Field

The description relates generally to Hall sensors, and more specifically to Hall sensor systems for use, e.g., in the automotive sector and other industrial applications (e.g., speed detection, lossless current sensing, and so on).

Description of the Related Art

High sensitivity and high bandwidth are desirable features of Hall sensors in various current applications (for instance in the automotive sector and other industrial applications).

Certain "fast" Hall sensor-based systems currently available combine a Hall probe with integrated coils so as to achieve a bandwidth in excess of 1 MHz.

Such a Hall probe may be operated by resorting to so-called "spinning" techniques to reduce offset effects.

Coils are not easy to integrate. Also, spinning techniques may be inherently slow insofar as they may involve, for instance, four steps for each measurement.

BRIEF SUMMARY

One or more embodiments provide high sensitivity and high bandwidth in Hall sensors.

One or more embodiments may be applied in integrated, broadband and notionally lossless current sensing arrangements.

One or more embodiments may extend the bandwidth of Hall sensor-based systems while keeping a good offset reduction.

One or more embodiments may thus provide broadband, lossless and integrated current sensing for power applications (for instance for radiofrequency-RF and automotive applications).

One or more embodiments may facilitate achieving a high bandwidth in combination with a high sensitivity and a low offset.

One or more embodiments may simplify the design of analog front-ends associated with a Hall sensor insofar as switches can be dispensed with.

One or more embodiments may provide a current sensing arrangement based on a Hall sensor of octagonal shape combined with a biasing/sensing method that avoids recourse to a spinning technique and/or integrated coils.

One or more embodiments may achieve offset values as low as 100 microtesla (µT) at 50 MHz. This is just twice the offset which may be achieved via a low-frequency spinning technique, while one or more embodiments may facilitate achieving a bandwidth which may be appreciably higher (for instance 50 times or 100 times) than the sample frequency in the case spinning readout is adopted.

One or more embodiments may thus provide a highly competitive low-cost/high-speed/high-sensitivity Hall-based sensor arrangement.

One or more embodiments may be applied to any type of linear Hall sensors.

BRIEF DESCRIPTION OF THE SEVERAL VIEWS OF THE DRAWINGS

One or more embodiments will now be described, by way of example only, by referring to the enclosed figures, wherein.

DETAILED DESCRIPTION

Figure 3:
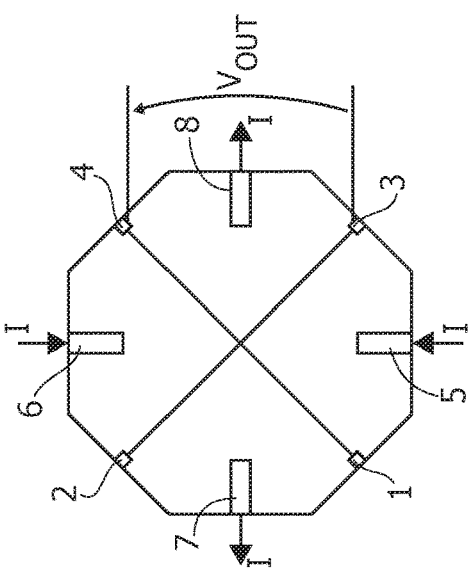
FIG. 3 further illustrates principles of operation underlying the embodiments of FIG. 1.

In the ensuing description one or more specific details are illustrated, aimed at providing an in-depth understanding of examples of embodiments. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is included in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the scope of protection or the scope of the embodiments.

Hall-effect sensing is an established technique. The basic principles of operation of Hall sensors are well known in the art, which makes it unnecessary to provide more detailed description herein.

Briefly, in the presence of a magnetic field $B_Z$ applied transverse to a (planar) Hall sensing element, a Hall voltage may be sensed across the sensing element transversally to the direction of a flow of a bias current between a pair of bias electrodes which is indicative of the intensity of the magnetic field B.

Various "fast" current sensing systems based on Hall sensors as discussed in the literature combine a Hall probe with integrated coils so as to achieve a bandwidth in excess of 1 MHz. The Hall probe may be operated by resorting to a spinning technique to reduce the offset.

State-of-the-art broadband current sensing is based on current transformers that are difficult to integrate in semiconductor technology.

Also, hybrid technologies using Hall probes together with coils may exhibit a non-flat frequency response.

In Jiang, J., et al.: "Multipath Wide-Bandwidth CMOS Magnetic Sensors" IEEE Journal of Solid-State Circuits (JSSC), Vol. 52, January 2017, pp. 198-209, a DC-biased Hall probe is disclosed which achieves a wide bandwidth and relies on a low-frequency (LF) path to achieve a low offset. In this solution, flatness of the overall frequency response is still an issue.

In L. Dalessandro, et al.: "High-performance planar isolated current sensor for power electronics applications", IEEE Transactions on Power Electronics (TPE) Volume 22, Issue 5, September 2007, pp. 1682-1692 a planar current sensor is disclosed including a magnetic current transformer and a Hall-effect element.

One or more embodiments as discussed herein may rely on an octagonal Hall sensor in the place of a standard square Hall sensor.

A possible structure for an octagonal Hall sensor is discussed extensively in U.S. Pat. No. 9,952,291 B2.

An octagonal geometry for a Hall plate is discussed in J. L. Ramirez, et al.: "Octagonal geometry Hall plate designed for the PiezoHall effect measurement", presented at the 28$^{th}$ Symposium on Microelectronics Technology and Devices (SBMicro), Curitiba, Brazil, 2-6 Sep. 2013.

One or more embodiments may dispense with "spinning" readout techniques. This facilitates achieving a larger bandwidth, while spatial averaging over two sensors realized on a same active area (a same n-well, for instance) may facilitate offset reduction.

One or more embodiments as exemplified herein include a planar Hall sensing element 10 adapted to be exposed to a magnetic field $B_Z$ transverse to the element 10, namely that is orthogonal to the plane of the figures) and the element includes a material such as a semiconductor material producing a Hall voltage indicative of the intensity of magnetic field when traversed by an electric current.

The general principles of operation of such a sensing element are known to those skilled in the art and are again discussed in U.S. Pat. No. 9,952,291 B2 (already cited).

A sensing element (briefly, sensor) 10 as discussed herein may be incorporated in an electronic device D (for instance in the automotive sector and other industrial applications) including user circuitry UC which may take advantage of a sensing signal Vout as provided by the sensor 10.

Devices such as DC-DC converters, RF power amplifiers, motor drivers, power inverters and, more generally, circuits involving an over-current-protection system may be exemplary of the device D.

In one or more embodiments, the sensing element 10 may have provided thereon (by known means) a set of sensing electrodes 1, 2, 3, 4 and a set of bias electrodes 5, 6, 7, 8, that is with the electrodes 1 to 8 at the vertexes of an octagonal shape.

In one or more embodiments, the sensing element 10 may have an octagonal shape overall, that is with the electrodes 1 to 8 at the vertexes of an octagonal shape.

In one or more embodiments, an arrangement of sensing electrodes includes:
- a first pair of sensing electrodes 1, 4 mutually opposed in a first direction D1 across the sensing element 10, and
- a second pair of sensing electrodes 2, 3 mutually opposed in a second direction D2 across the sensing element 10, with the second direction D2 orthogonal to the first direction D1, so that the sensing electrodes 1, 2, 3, 4 are arranged, so-to-say, according to a cross-like pattern.

In one or more embodiments, an arrangement of bias electrodes includes:
- a first pair of bias electrodes 5, 6 mutually opposed in a third direction D3 across the sensing element 10, and
- a second pair of bias electrodes 7, 8, mutually opposed in a fourth direction D4 across the sensing element 10 with the third direction D3 orthogonal to the fourth direction D4.

Similarly to the sensing electrodes 1 to 4, also the bias electrodes 5 to 8 may thus be arranged according to a cross-like pattern.

Figure 1:
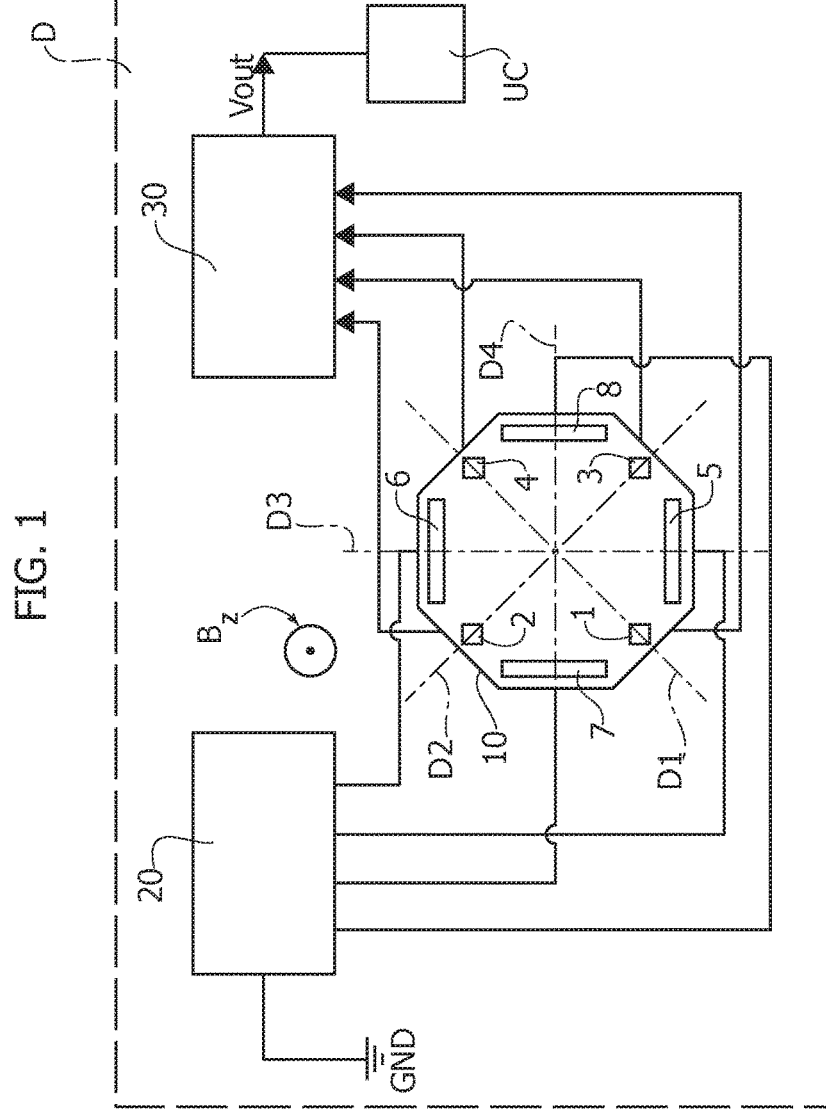
FIG. 1 is a diagram illustrating exemplary of embodiments of the present disclosure.

As seen in FIG. 1, where the directions D1 to D4 are expressly indicated (these are not represented in the other figures for the sake of simplicity), the third and fourth directions D3, D4 are rotated 45° with respect to the first and second directions D1, D2.

Consequently, in one or more embodiments, each one of the sensing electrodes 1 to 4 may be arranged between a bias electrode of the first pair 5, 6 and a bias electrode of the second pair 7, 8.

For instance, in one or more embodiments as exemplified herein:
- the sensing electrode 1 may be arranged between the bias electrode 5 (first pair) and the bias electrode 7 (second pair),
- the sensing electrode 2 may be arranged between the bias electrode 7 (second pair) and the bias electrode 6 (first pair),
- the sensing electrode 3 may be arranged between the bias electrode 5 (first pair) and the bias electrode 8 (second pair), and
- the sensing electrode 4 may be arranged between the bias electrode 6 (first pair) and the bias electrode 8 (second pair).

In one or more embodiments, the bias electrodes 5 to 8 may be bar-like electrodes with the bias electrodes in the first pair 5, 6 extending parallel to (FIGS. 1 and 4) or aligned with each other (FIGS. 2 and 3); this may also apply to the bias electrodes 7 and 8 in the second pair which may again be bar-like and extend parallel to (FIGS. 1 and 4) or aligned with (FIGS. 2 and 3) each other.

An arrangement as exemplified herein may thus be regarded as including two sensors adapted to be realized on a same active area (a same n-well, for instance), which may facilitate offset reduction as discussed in the following.

In one or more embodiments, the sensing element 10 may be coupled to:
- a bias module 20 configured to provide (as better detailed in the following) bias currents to the bias electrodes 5 to 8, and
- a readout circuit 30 which (again as better detailed in the following) is configured to read Hall voltages at the sensing electrodes 1 to 4 and provide a corresponding (voltage) output signal Vout.

In one or more embodiments, the bias module 20 may be configured to provide coupling to ground GND as discussed in the following.

A Hall sensor as discussed herein is a transducer capable of converting a magnetic field $B_Z$ into a potential difference and thus into a voltage signal Vout.

A main source of error in Hall sensors is the intrinsic offset, which may be higher than the Hall voltage.

A conventional approach to cope with offset is a four-phase spinning-current technique, which involves changing the bias direction and then averaging out the offset. This technique facilitates good offset reduction but inevitably entails a reduced bandwidth insofar as a complete measurement involves four sub-measurements.

One or more embodiments overcome this limitation and exploit the broadband capability of a Hall probe, while providing a fair offset reduction, by using in the place of a standard squared Hall sensor an octagonal Hall sensor.

As noted, such a sensor is known per se. One or more embodiments, however, may involve DC biasing the Hall sensor (probe) as depicted in FIG. 2, that is by forcing (i.e., injecting or supplying, for instance) a DC bias current I through the bias electrodes or contacts 5 and 6 in the first pair and the electrodes or contacts 7 and 8 of the second pair, so that, for instance, a DC current I will flow between (e.g., from) the electrode 5 and the electrode 6 and (e.g., to) the electrode 7 and the electrode 8.

One or more embodiments contemplate to that effect that the (second) bias contacts 7 and 8 are coupled (directly or via the module 20) to ground GND.

This may be effected, in a manner known to those of skill in the art, via the bias module 20.

One or more embodiments as exemplified herein may involve using an octagonal n-well (produced in manner known to those of skill in the art) as the magnetic-sensitive active region.

Figures 2A, 2B, 2C:
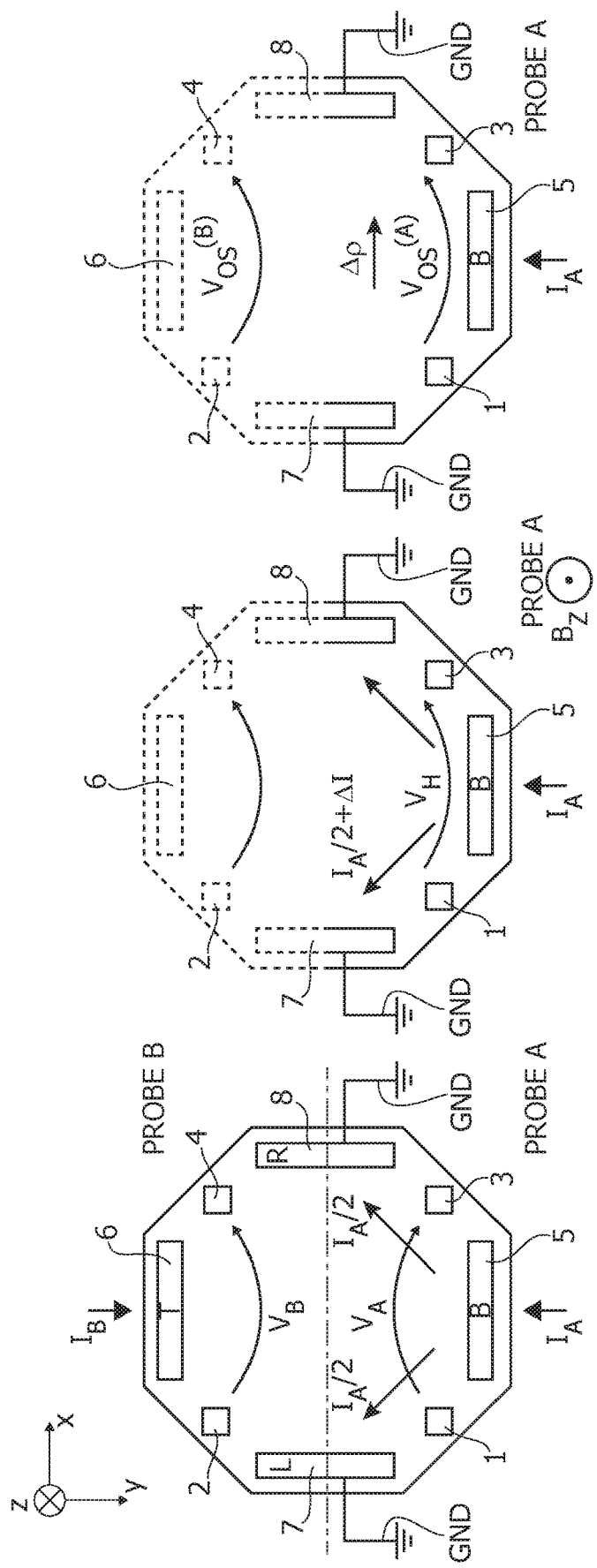
FIGS. 2A, 2B and 2C illustrate principles underlying operation of the embodiments of FIG. 1.

As shown in FIG. 2A this can be regarded as shared by two elementary Hall-effect probes, e.g.:
- a first probe (PROBE A), located below an intermediate (horizontal, parallel to the x-axis in the figure) axis of symmetry X10;
- a second probe (PROBE B) located above the axis X10.

In one or more embodiments as exemplified herein, the active region of the element 10 can be accessed through the four (e.g., smaller) sensing contacts 1 to 4 and the four (wider) bias contacts 5 to 8.

Two bias contacts or electrodes such as, for instance, contact 7 (Left or L) and contact 8 (Right or R) can be regarded as shared by the two Hall-effect probes A and B. These bias contacts can be connected to ground (either directly or via the circuit block 20.

Two bias currents $I_A$ and $I_B$ (which can be assumed to be notionally identical) can be forced through two other bias contacts or electrodes such as, for instance, bias contacts 5 (Bottom or B) and 6 (Top or T), respectively.

As exemplified herein the bias currents $I_A$ and $I_B$ are shown as fed or injected into the contacts or electrodes.

It will be otherwise appreciated that the various relationships discussed in the following will apply (with signs adapted accordingly) irrespective of the direction of flow of the bias currents $I_A$ and $I_B$ forced through two bias electrodes such as 5 and 6.

In one or more embodiments as exemplified herein output voltages $V_A$ and $V_B$ can be read from the two elementary probes, for instance across the sensing electrodes 1 and 3 ($V_A = V_3 - V_1$, for PROBE A) and across the sensing electrodes 2 and 4 ($V_B = V_4 - V_2$, for PROBE B), respectively, where $V_j$ denotes a voltage sensed at electrode j (j=1, ..., 4).

FIGS. 2B and 2C are exemplary of an unbalance in the bias current occurring when a magnetic field $B_z$ is applied orthogonally to element 10 and the generation of an offset voltage due to (for instance) a resistivity gradient.

In order to facilitate understanding, one may consider all the sensing electrodes (contacts) 1 to 4 as being electrically floating.

Under the assumption that the probe PROBE A is fully symmetric and homogeneous, in the absence of a magnetic field applied, the current density field lines along which the bias current $I_A$ flows will be perfectly balanced with respect to the y-axis (vertical in the figures), and the voltage $V_A$ is null or zero.

If a magnetic field component $B_z$ is applied on the z-axis, that is orthogonal to the plane of the figure as shown in FIG. 2B, then the current field lines become unbalanced (e.g., with a current $I_A/2 + \Delta I$ flowing from the electrode 5 to the electrode 7) due to the Hall effect thus giving rise to a Hall voltage $V_H = V_A$.

In case of semiconductor inhomogeneities, such as a gradient $\Delta \rho$ of the silicon resistivity $\rho$ along the x-axis (horizontal in the figures), an offset voltage $V_{OS}^{(A)}$ will be generated or produced independently of the presence of the magnetic field as shown in FIG. 2C. Such an offset voltage $V_{OS}^{(A)}$ will add to the Hall voltage $V_H$ so that the voltage $V_A$ will actually be:

$$V_A = V_H + V_{OS}^{(A)}$$

The source of offset, in this case the resistivity gradient $\Delta \rho$ of the silicon resistivity $\rho$ along the x-axis, will act in the same way on the (upper) probe PROBE B. This will give rise to an offset voltage $V_{OS}^{(B)}$ with the same sign of $V_{OS}^{(A)}$ and the same magnitude (assuming the gradient is constant throughout the probe).

As exemplified herein, the bias current $I_B$ has an opposite direction with respect to current $I_A$, therefore the Hall voltage as sensed between the electrodes 4 and 2 has an opposite sign with respect to the Hall voltage as sensed between the electrodes 3 and 1, so that the following relationship will apply:

$$V_B = -V_H + V_{OS}^{(B)}$$

By calculating (in the readout circuit 30, for instance) the difference $V_A - V_B$ between the two (floating) voltages $V_A$ and $V_B$ an output voltage will become available where the offset voltage will be (at least notionally) cancelled out:

$$V_{out} = V_A - V_B = 2V_H$$

This equation applies exactly if the sources of offset act similarly on both the elementary probes.

Indeed, local sources of offset may exist which may lead to a residual offset voltage. For instance, a point-like defect of the silicon crystal may represent a local source of offset. Also certain mismatches in the bias currents may lead to an offset unbalance.

These effects can be taken into account by re-writing the last relationship above as:

$$V_{out} = V_A - V_B = 2V_H + \Delta V_{OS}$$

where $\Delta V_{OS}$ is the residual offset.

It is noted that such a residual offset voltage related to local sources of offset can be observed also in Hall probes adopting a spinning-current readout arrangement. Dealing with the implementation of the subtraction operation in such an arrangement would require a fairly complex analog readout circuit to implement, with a fairly high input capacitance that might have a negative impact on the final bandwidth.

As schematically represented in FIG. 3, one or more embodiments may contemplate coupling (directly or via the readout module 30):
- the sensing electrode (contact) 2 with the sensing electrode 3, and
- the sensing electrode 1 with the sensing electrode 4.

That is, one or more embodiments couple (for instance, short-circuiting) the sensing electrodes in the pairs of sensing electrodes which are opposed along the diagonal axes of the octagonal sensing element 10, that is the pair of electrodes 1 and 4 and the pair of electrodes 2 and 3.

As a result, by keeping in mind that:

$$V_A = V_3 - V_1, \text{ for PROBE } A$$

$$V_B = V_4 - V_2, \text{ for PROBE } B$$

$$V_A = V_H + V_{OS}^{(A)}$$

$$V_B = -V_H + V_{OS}^{(B)},$$

such coupling will lead to $V_1 = V_4$ and $V_2 = V_3$ so that:

$$V_{out} = V_B = -V_A$$

and a Hall voltage contribution can be correctly sensed at the readout circuit block 30, with an offset (due, for instance, to a global source of offset such as the resistivity gradient) averaged out.

It is observed that coupling (short-circuiting) the sensing electrodes as discussed previously gives rise to approximately the same offset reduction as provided by the subtraction $V_A-V_B$ with a simpler readout circuit (e.g., a single differential amplifier) and reduced capacitive loading, thus wider bandwidth, with still a residual offset due to local sources of inhomogeneities.

By way of further explanation one may assume a null magnetic field impinging on the sensor plane, that is, $B_Z=0$ and assume the offset due only to global effects (for instance, a resistivity gradient), so that $V_A=V_{OS}^{(A)}$ and $V_B=V_{OS}^{(B)}$. Short-circuiting of the sensing contacts as shown in FIG. 3 implies the equality $V_A=V_B$. If the sign of the offsets $V_{OS}^{(A)}$ and $V_{OS}^{(B)}$ is equal (which is reasonable since they are generated by the same physical effect) then the only solution to all the previous equations is $V_{OS}^{(A)}=V_{OS}^{(B)}=0$.

As far as the offset is concerned, the short circuits may be regarded as an additional boundary condition applied to the net charge distribution throughout the probe that forces the minimization of the magnitude of the offset contributions to $V_B$ and $V_A$.

As discussed previously, if the physical origin and sign of the offset can be held to be the same for both elementary probes PROBE A and PROBE B (this being the case, for instance, of a constant resistivity gradient), then the only value of offset compliant with both the symmetry of the overall probe and the boundary condition imposed by the short circuits is zero.

Also, one or more embodiments may deal with the possible presence of a residual offset $\Delta V_{OS}$ in $V_{OUT}$ due to uncorrelated local defects and/or asymmetries (the amount of this residual offset can be evaluated experimentally).

One or more embodiments as exemplified herein can be implemented by resorting to a simple DC bias and a single differential amplifier, with no switching operation involved.

One or more embodiments may benefit from the absence of limits related to the use of a current-spinning approach and the reduction of the overall capacitance.

One or more embodiments may resort to multipath sensing to facilitate further reducing the offset and to an array of sensors to facilitate reducing noise.

Figure 4:
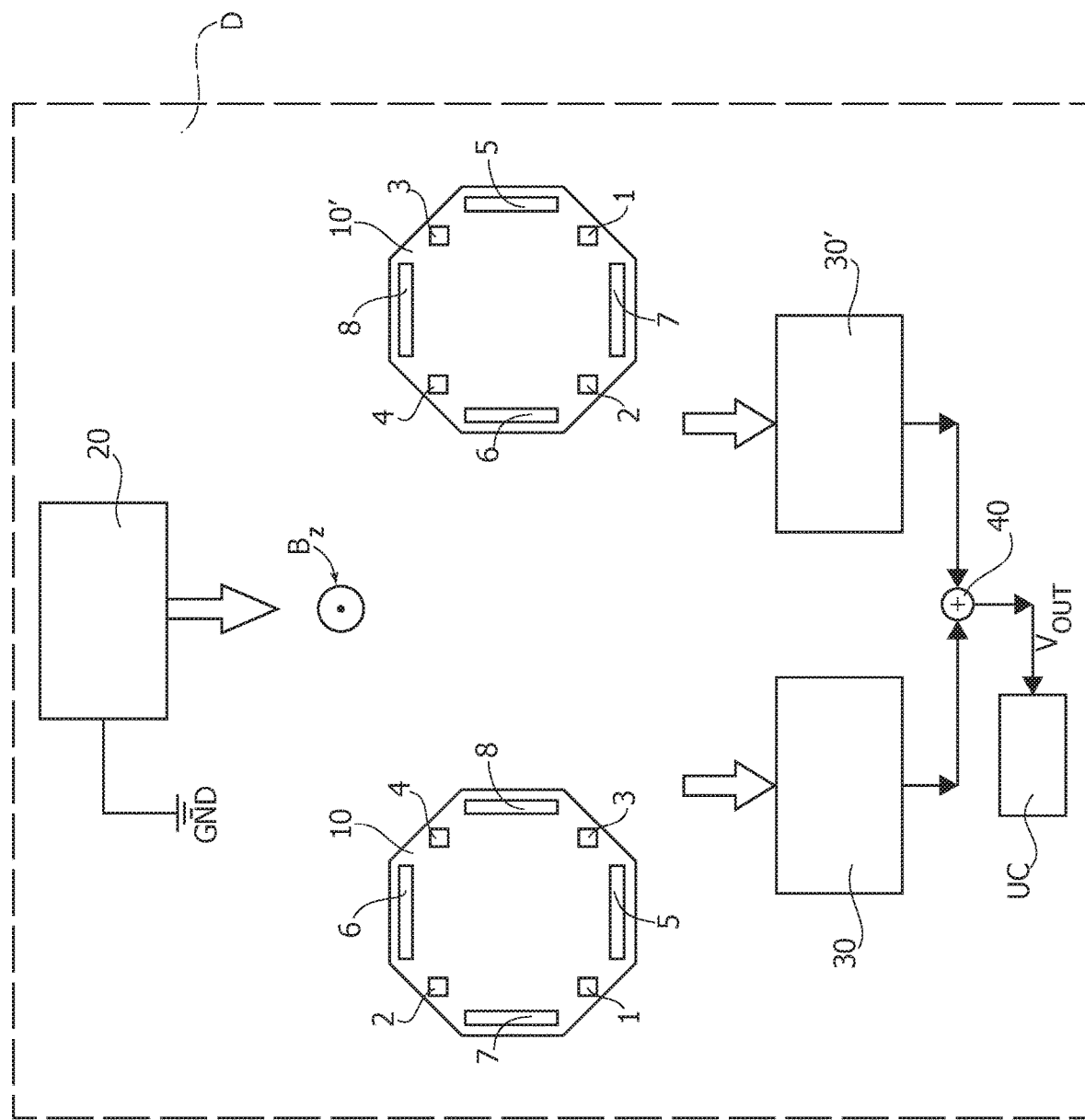
FIG. 4 illustrates another embodiment including an array of Hall sensors.

FIG. 4 is exemplary of the possibility of using to that effect an array of, e.g., two, planar Hall sensing elements 10, 10' as exemplified in the foregoing, rotated 90° to each other (while both exposed to a magnetic field $B_Z$ orthogonal to the plane of the figure).

The mutual 90° rotation can be appreciated in the figure by noting that the positions of electrodes/contacts 1 to 8 in the element 10' on the right are rotated (e.g., counterclockwise) with respect to the positions of the electrodes/contacts 1 to 8 in the element 10 on the left.

Details of the connections of the elements 10, 10' to the bias module(s) 20—only one is shown for simplicity—and the readout modules 30, 30' are not visible in FIG. 4 in order to avoid making the representation unnecessarily complicated.

The (constructive) coupling—e.g., parallel connection—of the readout modules 30, 30' is represented in FIG. 4 as a summation node 40 which produces or provides an output (voltage) signal Vout resulting from the contributions of both elements 10 and 10'.

The signal contributions (in phase and quadrature contributions) may thus combine constructively (e.g., add to each other) while the associated offset contributions further average out, the same also applying to the (thermal) noise contribution.

In one or more embodiments a Hall sensor includes:
a planar Hall sensing element (e.g., 10) configured to be exposed to a (transverse) magnetic field (e.g., B) and to produce at least one Hall voltage indicative of said magnetic field when traversed by an electric current,
a first pair of sensing electrodes (e.g., 1, 4) mutually opposed in a first direction (e.g., D1) across the sensing element,
a second pair of sensing electrodes (e.g., 2, 3) mutually opposed in a second direction (e.g., D2) across the sensing element, said second direction being orthogonal to said first direction,
a first pair of bias electrodes (e.g., 5, 6) mutually opposed in a third direction (e.g., D3) across the sensing element,
a second pair of bias electrodes (e.g., 7, 8) mutually opposed in a fourth direction (e.g., D4) across the sensing element, said fourth direction being orthogonal to the third direction,
wherein:
said third and fourth directions are rotated 45° with respect to said first and second direction, wherein each said sensing electrode is arranged between a bias electrode of said first pair and a bias electrode of said second pair;
a bias circuit (e.g., 20) is provided configured to force a DC bias current between the first pair of bias electrodes and the second pair of bias electrodes;
a readout circuit (e.g., 30) is provided configured to sense a first Hall voltage at the sensing electrodes of the first pair of sensing electrodes and a second Hall voltage at the sensing electrodes of the second pair of sensing electrodes, the readout circuit configured to provide an output voltage (e.g., Vout) which is a function of the difference between said first Hall voltage sensed at the sensing electrodes of the first pair of sensing electrodes and said second Hall voltage sensed at the sensing electrodes of the second pair of sensing electrodes.

In one or more embodiments:
the bias electrodes in the second pair of bias electrodes may be coupled (directly) to ground (e.g., GND), or
the bias circuit may be configured to couple to ground the bias electrodes in the second pair of bias electrodes.

In one or more embodiments:
the sensing electrodes in the first pair of bias electrodes and the sensing electrodes in the second pair of sensing electrodes, respectively, may be coupled to each other, or
the readout circuit may be configured to couple to each other the sensing electrodes in the first pair of bias electrodes and the sensing electrodes in the second pair of sensing electrodes, respectively.

In one or more embodiments, a sensor device includes a first Hall sensor (e.g., 10) and a second Hall sensor (e.g., 10'), the first and second Hall sensors arranged with the first, second, third and fourth directions in the first Hall sensor rotated 90° with respect to the first, second, third and fourth (D4) directions in the second Hall sensor.

In one or more embodiments, the first Hall sensor and the second Hall sensor include readout circuits (e.g., 30, 30') providing respective output voltages, said readout circuits mutually coupled (e.g., 40) and configured to provide a resulting output voltage by constructively combining (e.g., by adding) said respective output voltages.

In one or more embodiments, an electronic device includes:
- a Hall sensor or a sensor device according to one or more embodiments; and
- user circuitry (e.g., UC) coupled to said Hall sensor or sensor device to receive said output voltage therefrom.

In one or more embodiments, a method includes:
a) providing at least one planar Hall sensing element comprising:
  - a first pair of sensing electrodes mutually opposed in a first direction across the sensing element,
  - a second pair of sensing electrodes mutually opposed in a second direction across the sensing element, said second direction being orthogonal to said first direction,
  - a first pair of bias electrodes mutually opposed in a third direction across the sensing element,
  - a second pair of bias electrodes mutually opposed in a fourth direction across the sensing element (10), said fourth direction being orthogonal to said third direction (D3),
  - wherein said third and fourth directions are rotated 45° with respect to said first and second direction, wherein each said sensing electrode is arranged between a bias electrode of said first pair and a bias electrode of said second pair;
b) exposing the at least one planar Hall sensing element (e.g., 10, 10') to a magnetic field (e.g., B) transverse to the plane of the at least one planar Hall sensing element;
c) forcing a DC bias current between the first pair of bias electrodes and the second pair of bias electrodes;
d) sensing a first Hall voltage at the sensing electrodes of the first pair of sensing electrodes and a second Hall voltage at the sensing electrodes of the second pair of sensing electrodes; and
e) providing an output voltage which is a function of the difference between said first Hall voltage sensed at the sensing electrodes of the first pair of sensing electrodes and said second Hall voltage sensed at the sensing electrodes of the second pair of sensing electrodes wherein said output voltage is indicative of (the intensity of) said magnetic field.

Without prejudice to the underlying principles, the details and embodiments may vary, even significantly, with respect to what has been described by way of example only without departing from the extent of protection.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A Hall sensor, comprising:
a planar Hall sensing element configured to be exposed to a magnetic field and configured to produce at least one Hall voltage indicative of said magnetic field in response to being traversed by an electric current;
a first pair of sensing electrodes mutually opposed in a first direction across the sensing element;
a second pair of sensing electrodes mutually opposed in a second direction across the sensing element, said second direction being orthogonal to said first direction;
a first pair of bias electrodes mutually opposed in a third direction across the sensing element;
a second pair of bias electrodes mutually opposed in a fourth direction across the sensing element, said fourth direction being orthogonal to the third direction; and
a bias circuit coupled to the first and second pairs of bias electrodes and configured to pass a first portion of a DC bias current from a first bias electrode of the first pair of bias electrodes to a first bias electrode of the second pair of bias electrodes and to pass a second portion of the bias current from the first bias electrode of the first pair of bias electrodes to a second bias electrode of the second pair of bias electrodes;
wherein said third and fourth directions are rotated forty-five degrees with respect to said first and second directions, each said sensing electrode arranged between a bias electrode of said first pair and a bias electrode of said second pair.

2. The Hall sensor of claim 1 further comprising a readout circuit configured to sense a first Hall voltage at the sensing electrodes of the first pair of sensing electrodes and a second Hall voltage at the sensing electrodes of the second pair of sensing electrodes, and the readout circuit configured to provide an output voltage which is a function of a difference between said first Hall voltage and said second Hall voltage.

3. The Hall sensor of claim 2, wherein the bias electrodes in the second pair of bias electrodes are coupled to ground.

4. The Hall sensor of claim 2, wherein the bias circuit is further configured to couple to ground the bias electrodes in the second pair of bias electrodes.

5. The Hall sensor of claim 1, wherein the sensing electrodes in the first pair of sensing electrodes are coupled to each other and the sensing electrodes in the second pair of sensing electrodes are coupled to each other.

6. The Hall sensor of claim 1, wherein the readout circuit is further configured to couple together the sensing electrodes in the first pair of sensing electrodes and configured to couple together the sensing electrodes in the second pair of sensing electrodes.

7. The Hall sensor element of claim 1, wherein the planar Hall sensing element comprises an octagonal n-well.

8. A Hall sensor, comprising:
a sensing element;
a first pair of sensing electrodes spaced apart along a first direction on the sensing element and a second pair of sensing electrodes spaced apart along a second direction on the sensing element, the second direction orthogonal to the first direction; and
a first pair of bias electrodes spaced apart along a third direction on the sensing element and a second pair of bias electrodes spaced apart along a fourth direction on the sensing element, the fourth direction being orthogonal to the third direction, each sensing electrode of the first and second pairs of sensing electrodes being between one of the bias electrodes of the first pair of bias electrodes and one of the bias electrodes of the second pair of bias electrodes, one bias electrode of the first pair of bias electrodes is configured to receive a first DC bias current having a first direction and the other bias electrode of the first pair of bias electrodes is configured to receive a second DC bias current having a second direction that is opposite to the first direction.

9. The Hall sensor of claim 8, wherein the first direction is rotated forty-five degrees relative to the third direction.

10. The Hall sensor of claim 9, wherein the sensing element has an octagonal shape.

11. The Hall sensor of claim 9, wherein the first pair of sensing electrodes are configured to be coupled together and the second pair of sensing electrodes are configured to be coupled together.

12. A Hall sensor, comprising:
a first sensing element and a second sensing element, each of the first and second sensing elements including:
a first pair of sensing electrodes spaced apart along a first direction on the sensing element and a second pair of sensing electrodes spaced apart along a second direction on the sensing element, the second direction orthogonal to the first direction; and
a first pair of bias electrodes spaced apart along a third direction on the sensing element and a second pair of bias electrodes spaced apart along a fourth direction on the sensing element, the fourth direction being orthogonal to the third direction, each sensing electrode of the first and second pairs of sensing electrodes being between one of the bias electrodes of the first pair of bias electrodes and one of the bias electrodes of the second pair of bias electrodes; and
a bias circuit configured to couple to a DC reference voltage each bias electrode of each second pair of bias electrodes;
wherein each of the first, second, third and fourth directions of the first sensing element is rotated by ninety degrees relative to each of the first, second, third and fourth directions of the second sensing element.

13. The Hall sensor of claim 12, wherein each of the first and second sensing elements is in a same n-well.

14. The Hall sensor of claim 12, further comprising:
first and second readout circuits coupled to the first and second sensing elements, respectively, the first and second readout circuit configured to provide first and second output voltages, respectively; and
a summation circuit configured to provide a resulting output voltage based on the first and second output voltages.

15. The Hall sensor of claim 14, further comprising user circuitry coupled to the summation circuit to receive resulting output voltage.

16. The Hall sensor of claim 15, wherein the bias circuit is configured to supply to one bias electrode of each first pair of bias electrodes a first bias current having a first direction and to supply to the other bias electrode of the first pair of bias electrodes a second bias current having a second direction that is opposite to the first direction.

17. The Hall sensor of claim 12, wherein in each of the first and second sensing elements the first direction is rotated forty-five degrees relative to the third direction.

* * * * *